(12) United States Patent
Simonis et al.

(10) Patent No.: US 10,029,609 B2
(45) Date of Patent: Jul. 24, 2018

(54) STEERING-COLUMN SWITCH UNIT FOR OPERATING AT LEAST ONE ELECTRICAL CONSUMER, WHICH IS OPERATED BY AN ELECTRIC LOAD CURRENT, MOTOR VEHICLE AND METHOD FOR PRODUCING A STEERING-COLUMN SWITCH UNIT

(71) Applicant: VALEO Schalter und Sensoren GmbH, Bietigheim-Bissingen (DE)

(72) Inventors: Karl Simonis, Bietigheim-Bissingen (DE); Roland Gruener, Bietigheim-Bissingen (DE)

(73) Assignee: VALEO Schalter und Sensoren GmbH, Bietigheim-Bissingen (DE)

( * ) Notice: Subject to any disclaimer, the term of this patent is extended or adjusted under 35 U.S.C. 154(b) by 0 days.

(21) Appl. No.: 15/029,745

(22) PCT Filed: Sep. 26, 2014

(86) PCT No.: PCT/EP2014/070648
§ 371 (c)(1),
(2) Date: Apr. 15, 2016

(87) PCT Pub. No.: WO2015/055402
PCT Pub. Date: Apr. 23, 2015

(65) Prior Publication Data
US 2016/0229332 A1    Aug. 11, 2016

(30) Foreign Application Priority Data
Oct. 16, 2013 (DE) ........................ 10 2013 017 246

(51) Int. Cl.
*B60Q 1/14* (2006.01)
*B23K 1/00* (2006.01)
*H05K 3/30* (2006.01)

(52) U.S. Cl.
CPC .......... *B60Q 1/1469* (2013.01); *B23K 1/0016* (2013.01); *H05K 3/303* (2013.01)

(58) Field of Classification Search
CPC ......... B23K 1/0016; B60Q 1/14; H05K 3/303
(Continued)

(56) References Cited

U.S. PATENT DOCUMENTS

2004/0003988 A1 * 1/2004 Koyasu ................ B60Q 1/1461
200/292

FOREIGN PATENT DOCUMENTS

FR      2 955 969 A1    8/2011
WO    2008/155360 A1    12/2008

OTHER PUBLICATIONS

International Search Report issued in PCT/EP2014/070648 dated Dec. 18, 2014 (2 pages).
(Continued)

*Primary Examiner* — Edwin A. Leon
*Assistant Examiner* — Iman Malakooti
(74) *Attorney, Agent, or Firm* — Osha Liang LLP

(57) ABSTRACT

The invention relates to a steering-column switch unit (1) for operating at least one electrical consumer, which is operated by an electric load current, in a motor vehicle, with a printed circuit board (5) on which strip conductors (9, 11) are arranged, said strip conductors being connected to electrically conductive contact surfaces (8, 10, 13) for contact elements (15, 15') which are movable with a steering-column lever (16), wherein the strip conductors (9, 11) are configured for the load current.

12 Claims, 3 Drawing Sheets

(58) Field of Classification Search
USPC .................................................. 200/61.54
See application file for complete search history.

(56) References Cited

OTHER PUBLICATIONS

Written Opinion of the International Searching Authority issued in PCT/EP2014/070648 dated Dec. 18, 2014 (5 pages).

* cited by examiner

STEERING-COLUMN SWITCH UNIT FOR OPERATING AT LEAST ONE ELECTRICAL CONSUMER, WHICH IS OPERATED BY AN ELECTRIC LOAD CURRENT, MOTOR VEHICLE AND METHOD FOR PRODUCING A STEERING-COLUMN SWITCH UNIT

The invention relates to a steering-column switch unit for operating at least one electrical consumer, which is operated by an electric load current, in a motor vehicle. The steering-column switch unit comprises a printed circuit board on which strip conductors are arranged, said strip conductors being connected to electrically conductive contact surfaces for contact elements which are movable with a steering-column lever. The invention also relates to a motor vehicle with such a steering-column switch unit and to a method for producing a steering-column switch unit for a motor vehicle.

Diverse configurations of steering-column switch units for motor vehicles are already known from the prior art. A difference is basically made between two variants of steering-column switches: steering-column switches are known in which, when the steering-column lever is actuated, load currents are directly switched in the steering-column switch module and are used to directly supply the associated electrical consumer. Secondly, variants of steering-column switches are also known in which, when the steering-column lever is actuated, only control currents are switched in the steering-column switch module, said control currents in turn being supplied to a control device which then activates the electrical consumer depending on the control currents. In this variant, the electric load current therefore does not flow via the steering-column switch. Mixed variants are also known, in which firstly coded control currents and secondly load currents have to be switched in the steering-column switch unit. Such a steering-column switch unit can have, for example, two steering-column levers, wherein, when a first lever is actuated, the control currents are switched and, when the second lever is actuated, the load currents are switched.

Due to the multiplicity of possible variants, the production of steering-column switch units has proven to be relatively complicated. While, in the case of the variant with control currents, a printed circuit board with strip conductors and contact surfaces is customarily provided, in the case of the variant with load currents punched parts which are insert-moulded with plastic and have associated electrical lines have to be used. If a mixed variant is selected, both a printed circuit board and a separate punched part have to be provided, said punched part having contact surfaces which are configured for the load current. While the control currents namely have a current strength in the milliampere range—approximately from 1 to 50 mA, the current strength of the load current is customarily significantly higher and lies approximately within a range of values of 5 to 10 A, depending on the consumer. This is true of a network voltage of 12 V.

Accordingly, steering-column switch units in which control currents have to be switched when a first steering-column lever is actuated and load currents have to be switched when a second steering-column lever is actuated are relatively complicated and costly. In addition, it is disadvantageous that resistors for signal coding can be integrated on the punched parts only with difficulty and in a relatively complicated manner. A common connector through which the control currents and the load currents can be guided can be realized only with great difficulty.

It is an object of the invention to provide a steering-column switch unit, a motor vehicle and a method which, in comparison to the prior art, permits a reduction in the production outlay on the steering-column switch unit.

This object is achieved according to the invention by a steering-column switch unit, by a motor vehicle and by a method with the features according to the respective independent patent claims. Advantageous embodiments of the invention are the subject matter of the dependent patent claims, the description and the figures.

A steering-column switch unit according to the invention is designed for operating at least one electrical consumer, which is operated by an electric load current, in a motor vehicle. The steering-column switch unit can be designed, for example, as a steering-column switch module which can be placed onto the steering column of the motor vehicle. The steering-column switch unit can have one or more steering-column levers. The steering-column switch unit comprises a printed circuit board (PCB) on which strip conductors are arranged, said strip conductors being connected to electrically conductive contact surfaces which are contacted by contact elements which are moved with a steering-column lever. According to the invention, it is provided that the strip conductors are configured for the load current.

In other words, the strip conductors are designed for operating with the load current and are therefore dimensioned in such a manner that, during the operation of the consumer, the load current can flow nondestructively via the strip conductors without destroying the printed circuit board or the strip conductors. The strip conductors can be suitable here for operation with a current power of greater than 1 A, in particular greater than 5 A, preferably greater than 10 A. The steering-column switch unit according to the invention has the advantage that the strip conductors which are provided on the printed circuit board can be used for all possible variants of the steering-column switch unit. If the variant with control currents is selected, the control currents can be guided to the control device via the strip conductors. In this variant, the strip conductors are then overdimensioned. If, however, the variant with the load current is selected, the load current can be guided via the strip conductors to the consumer. A mixed variant is also possible. No separate punched parts therefore need to be used for the load current variant, and therefore the outlay during the production of steering-column switch units is significantly reduced in comparison to the prior art.

Different variants of the steering-column switch unit are therefore possible:

In one embodiment, it is provided that the abovementioned contact surfaces are designed for switching control currents which are output to a control device of the consumer. The control device then activates the electrical consumer depending on said control currents. In this embodiment, the control currents are guided via the strip conductors during the operation of the steering-column switch unit, and therefore the strip conductors are correspondingly overdimensioned. The control currents namely customarily have a current strength which lies within a range of values of 1 to 50 mA.

In an alternative embodiment and therefore in a second variant, it can be provided that the contact surfaces are designed for switching the load current such that the load current is guided via the strip conductors during the operation of the steering-column switch unit.

If the load current variant is selected, the contact surfaces can be surfaces of an add-on part which is fastened to the printed circuit board. This embodiment has the advantage that, during the production of the printed circuit board together with the strip conductors, first contact surfaces which are designed for switching the control currents can also be provided. This printed circuit board can then be used for all possible variants. If the load current variant is selected, the add-on part is additionally also fastened to said printed circuit board, said add-on part therefore being present only in the case of the load current variant. Second contact surfaces which are designed for switching the load current are then arranged on said add-on part. For all of the variants, a standard printed circuit board can therefore be produced.

The add-on part mentioned can be, for example, a punched part, in particular a punched part which is insert-moulded with plastic. Such a punched part can firstly be produced without a great deal of outlay and secondly is particularly suitable for switching the load current.

In respect of the fastening, it has been shown to be advantageous if the add-on part is designed as an SMD component (Surface Mounted Device) which is soldered on the printed circuit board in SMT technology (Surface Mounted Technology). The printed circuit board can therefore be fitted with all possible electronic components in SMT technology in a single production step.

Firstly, the add-on part can be arranged in a recess of the printed circuit board. Said recess is arranged preferably precisely at that point of the printed circuit board at which the abovementioned first contact surfaces are provided. If the load current variant is therefore selected, said first contact surfaces are punched out as it were. This has the advantage that the add-on part can be fastened to the printed circuit board in such a manner that said add-on part ends flush with the printed circuit board. The contact surfaces of the add-on part are then arranged precisely at the location of the first contact surfaces.

Secondly, however, it can also be provided that the add-on part together with the second contact surfaces for switching the load current via the first contact surfaces is arranged on the printed circuit board. Therefore, nothing needs to be changed on the printed circuit board itself.

The invention also relates to a motor vehicle, in particular to a passenger vehicle, with a steering-column switch unit according to the invention.

A method according to the invention serves for producing a steering-column switch unit for operating at least one electrical consumer, which is operated by an electric load current, in a motor vehicle. A printed circuit board is provided on which electrically conductive first contact surfaces for contact elements which are movable with a steering-column lever and strip conductors which are configured for the load current are provided. A variant for the steering-column switch unit is then selected from at least one first variant (control current variant) and second variant (load current variant), wherein, in the case of the first variant, electric control currents for a control device are guided via the first contact surfaces and the strip conductors and, in the case of the second variant, the load current is guided via the strip conductors. If the first variant is selected, the printed circuit board is used together with the first contact surfaces and the strip conductors for switching the control currents. If, however, the second variant is selected, an add-on part with second contact surfaces, which are electrically connected to the strip conductors, is fastened to the printed circuit board, and the printed circuit board is used together with the second contact surfaces of the add-on part and the strip conductors for switching the load current.

The preferred embodiments presented with regard to the steering-column switch unit according to the invention and the advantages of said embodiment apply correspondingly to the motor vehicle according to the invention and to the method according to the invention.

Further features of the invention emerge from the claims, the figures and the description of the figures. All of the features and combinations of features mentioned above in the description and the features and combinations of features mentioned below in the description of the figures and/or shown by themselves in the figures can be used not only in the respectively stated combination, but also in other combinations or else on their own.

The invention is now explained in more detail with reference to a preferred exemplary embodiment and by reference to the attached drawings, in which.

Figure 1:
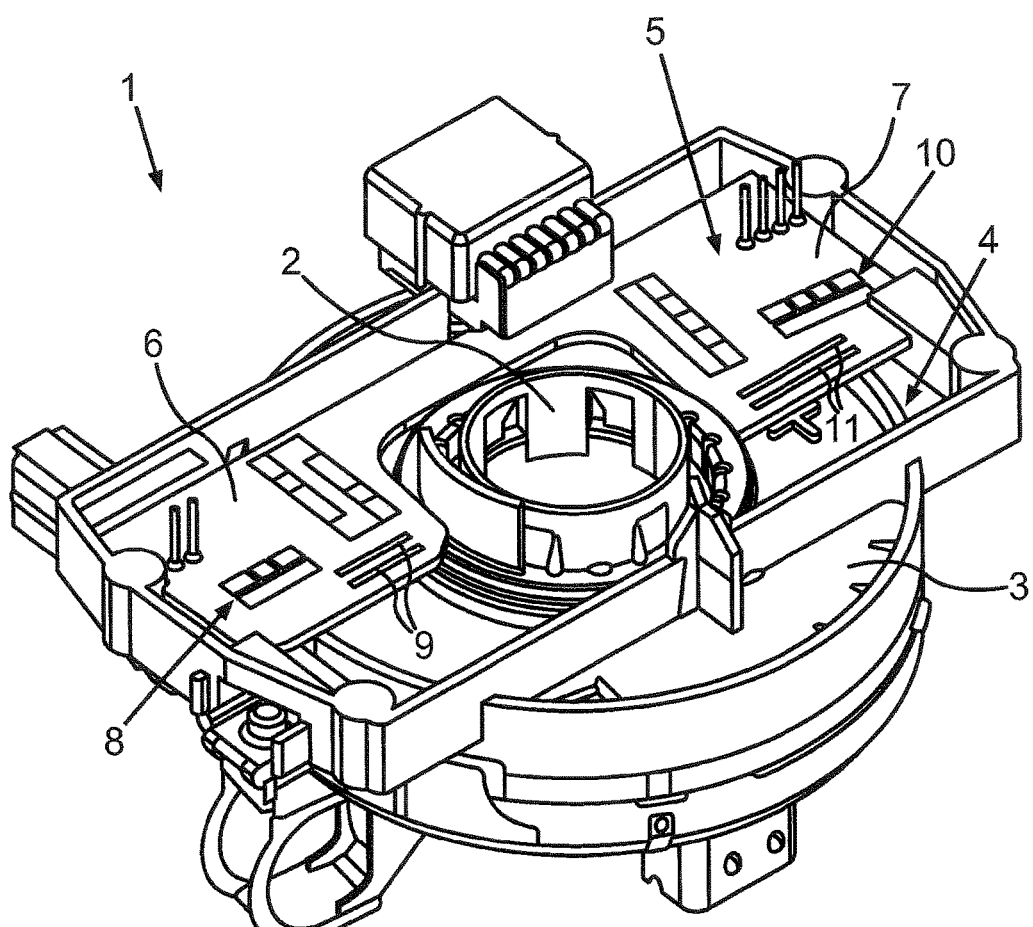
FIG. 1 shows, in a schematic and perspective illustration, a steering-column switch unit according to an embodiment of the invention.

A steering-column switch unit 1 which is illustrated in FIG. 1 is designed in the form of a steering-column module which can be installed on a steering column of a passenger vehicle. The steering-column switch unit 1 comprises a hub part 2 which can be plugged onto the steering shaft of the steering column. The steering-column switch unit 1 furthermore comprises a housing 3 which is arranged in a positionally fixed manner on the steering column. When the steering wheel is turned, only the hub part 2 is therefore rotated relative to the housing 3.

A what is referred to as a flat conductor or a winding spring via which electric signals are transmitted between units, on the one hand, which are located in the steering wheel, and control devices, on the other hand, which are arranged in a fixed position in the vehicle can also be arranged in the housing 3.

One or more steering-column levers can be fastened to the housing 3 and then serve for operating different consumers in the motor vehicle. For example, a pump of a window washer system and/or an electric motor of a window wiper and/or the turn indicators of the motor vehicle and/or the headlights can be controlled with a steering-column lever.

A printed circuit board 5 (circuit board) is arranged in a receptacle 4 in the housing 3, said printed circuit board being designed in the exemplary embodiment for operation with two steering-column levers, namely a left and a right steering-column lever. Accordingly, the printed circuit board 5 is divided into a left and a right region 6, 7. First contact surfaces 8 which are electrically coupled to strip conductors 9 (indicated schematically) are provided in the left region 6. Alternatively, said strip conductors 9 may also be arranged on the opposite rear side of the printed circuit board 5; furthermore alternatively, the printed circuit board 5 may also be designed as a multilayered printed circuit board, and the strip conductors 9 can be arranged in an inner layer of the printed circuit board 5.

Accordingly, first contact surfaces 10 which are electrically connected to the strip conductors 11 (which are indicated schematically) are also formed in the right region 7 on the printed circuit board 5. These strip conductors 11 may optionally also be arranged on the rear side or else in an inner layer of the printed circuit board 5.

Depending on the variant of the steering-column switch unit 1, load currents or control currents are switched in the housing by the respective steering-column lever. The load current is the electric current with which the electrical consumer is directly supplied. By contrast, control currents constitute control signals which are output to a control device by means of which the consumer is in turn activated. A mixed variant is also possible in which the load currents are switched with one steering-column lever and the control currents are switched with another steering-column lever.

The first contact surfaces 8, 10, which are illustrated in FIG. 1, are designed for switching the control currents and are also dimensioned accordingly. Said contact surfaces 8, 10 may be, for example, gold-plated or silver-plated. However, the strip conductors 9 and/or the strip conductors 11 are designed for operation with the load current and are therefore dimensioned in such a manner that they can guide an electric current of 5 A to more than 10 A. Said strip conductors 9 and/or 11 are therefore formed from a thicker material (for example copper) than strip conductors which are configured merely for the control currents in the milliampere range.

Such a printed circuit board 5, as illustrated in FIG. 1, can therefore be used for all possible variants of the steering-column switch unit 1. If a variant exclusively with control currents is selected, said control currents are conducted via the first contact surfaces 8 and/or 10 and via the strip conductors 9 and/or 11. The strip conductors 9 and/or 11 are overdimensioned here.

Figure 2:
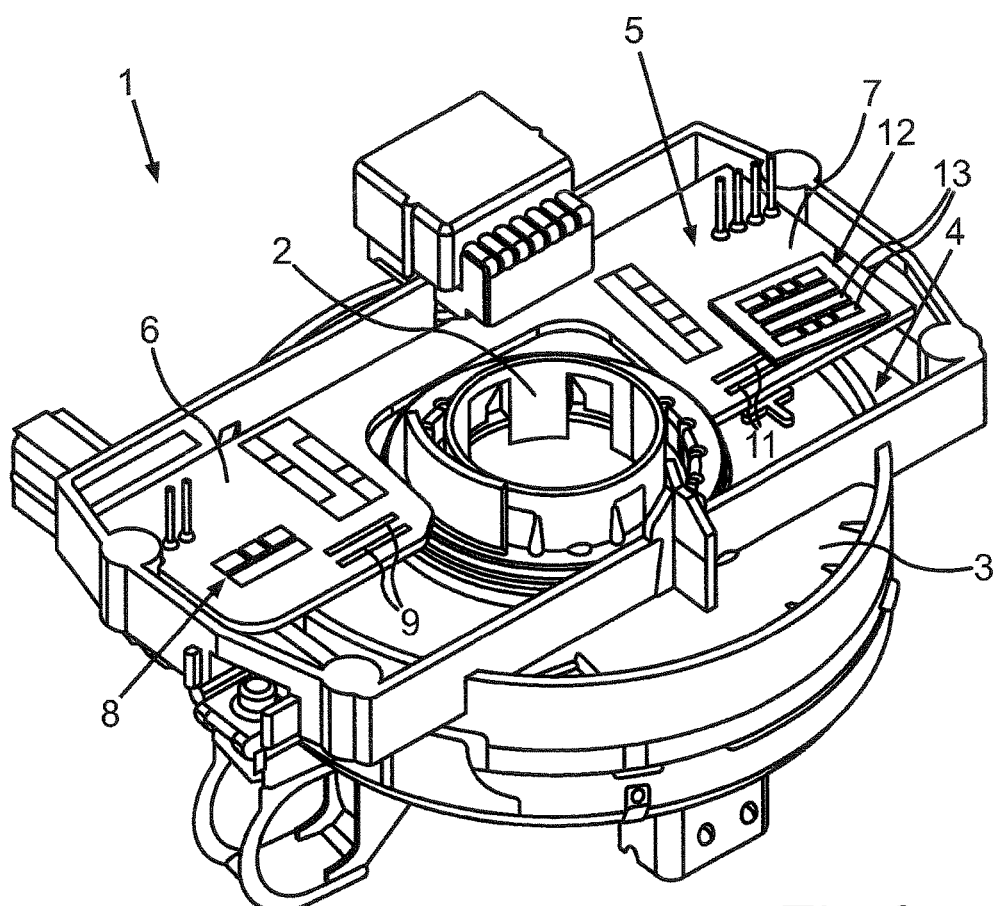
FIG. 2 shows the steering-column switch unit with an add-on part.

If, however, a second variant is selected in which one of the steering-column levers or the two steering-column levers have to switch the load currents, use is made of an add-on part 12 as illustrated in FIG. 2 for the right region 7 of the printed circuit board 5. Second contact surfaces 13 which are designed for switching the load current are provided on said add-on part 12. Said contact surfaces 13 are therefore correspondingly dimensioned such that they can be operated with an electric current of 5 A to more than 10 A. Said contact surfaces 13 are connected to the strip conductors 11 which are in any case already optimized for the load current.

Figure 3:
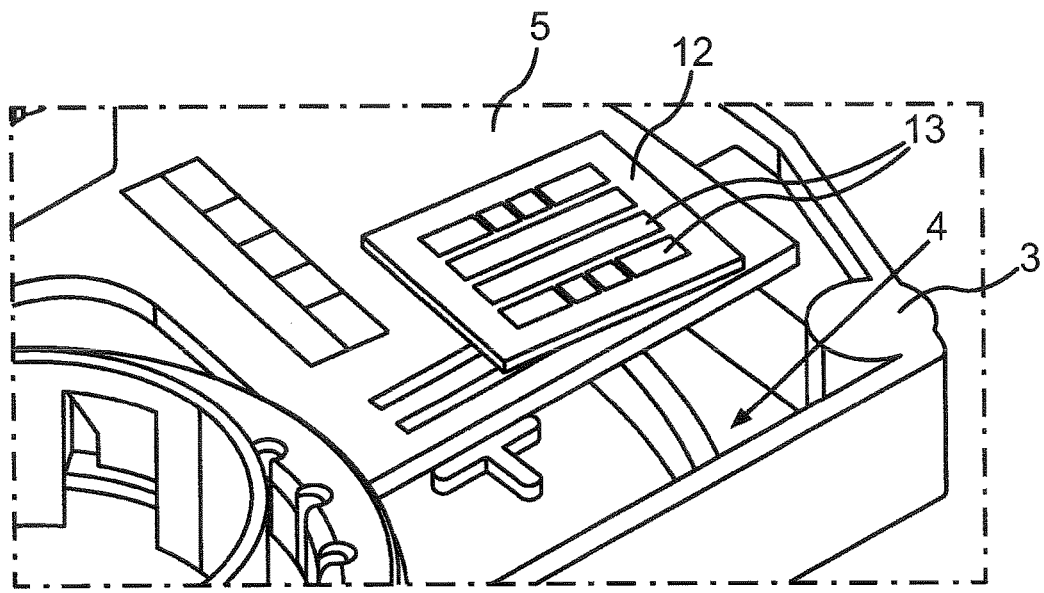
FIG. 3 shows the add-on part in an enlarged illustration.

As revealed in FIG. 3, the add-on part 12 can be designed as a punched part which is insert-moulded with plastic and is fastened to the printed circuit board 5 directly via the first contact surfaces 10. Said fastening may be undertaken, for example, such that the add-on part 12 is provided as an SMD component and is then soldered on the surface of the printed circuit board 5. Alternatively, however, it is also possible to provide a recess in the printed circuit board 5 such that the first contact surfaces 10 are punched out as it were, and the add-on part 12 can then be arranged within said recess. The add-on part 12 then ends flush with the surface of the printed circuit board 5.

Figure 4:
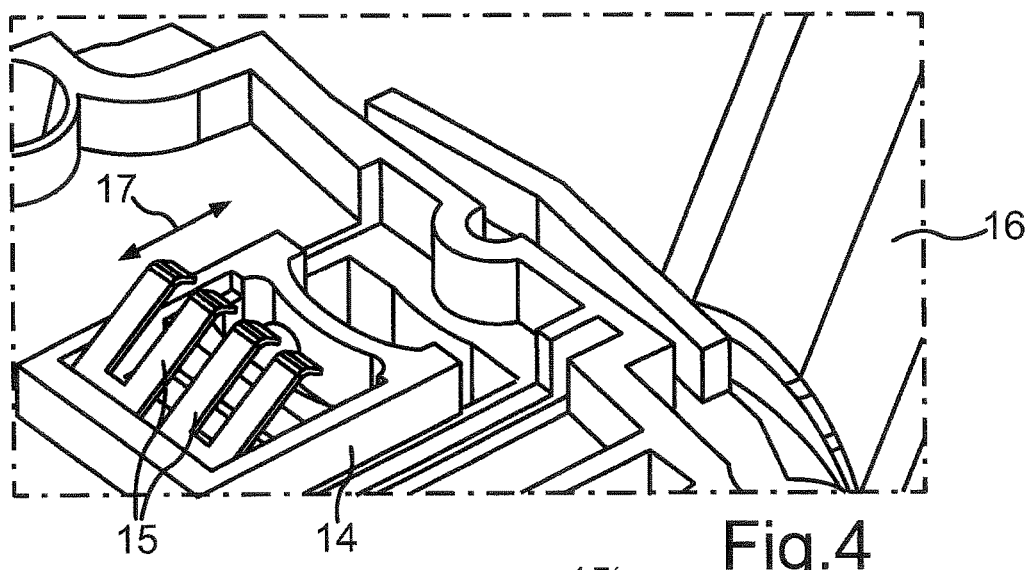
FIGS. 4 and 5 show sliding elements with electric contact elements.
Figure 5:
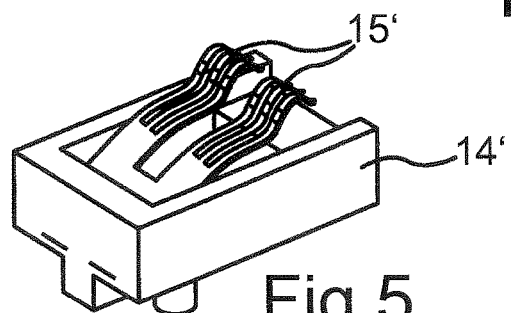

FIG. 4 illustrates a sliding element 14 with electric contact elements 15 which are designed as spring contacts and constitute the counterpart for the second contact surfaces 13. Said contact elements 15 are therefore designed for switching the load current. When a steering-column lever 16 is actuated, the sliding element 14 is displaced between two or more positions in accordance with the arrow depiction 17. If, by contrast, the control current variant is selected, use is made of a sliding element 14' with contact elements 15' as are illustrated in FIG. 5 and are designed for switching the control currents. As emerges from FIGS. 4 and 5, the contact elements 15 for the load current are dimensioned to be significantly larger and more sturdy than the contact elements 15'. After selecting the load current variant, the sliding element 14 is therefore used; and the sliding element 14' is used after selecting the control current variant.

During the production of the steering-column switch unit 1, first of all the printed circuit board 5 is produced together with the first contact surfaces 8 and/or 10 and with the strip conductors 9 and/or 11. A variant of the steering-column switch unit 1 is then selected, to be precise from the first variant (control current variant) and the second variant (load current variant). With at least two steering-column levers, a mixed variant is also possible. If the first variant is selected, the printed circuit board 5 is used as shown in FIG. 1. If the second variant is selected, the optional add-on part 12 is additionally also fastened to the printed circuit board 5, and the printed circuit board 5 is used together with the add-on part 12. In the first variant, the sliding element 14' according to FIG. 5 is used while, in the second variant, the sliding element 14 according to FIG. 4 is used.

It is also possible to use such an add-on part 12 in the left region 6 of the printed circuit board 5 too. If two steering-column levers have to switch load currents, two such add-on parts 12 can also be used, namely both on the left and on the right.

The invention claimed is:

1. A steering-column switch unit for operating at least one electrical consumer, which is operated by an electric load current, in a motor vehicle, comprising:
    a printed circuit board on which strip conductors are arranged, said strip conductors being connected to electrically conductive contact surfaces for contact elements which are movable with a steering-column lever,
        wherein the strip conductors are configured for the electric load current,
        wherein the contact surfaces are configured for switching the load current such that the load current is guided via the strip conductors, and
        wherein the contact surfaces are surfaces of an add-on part which is fastened to the printed circuit board.

2. The steering-column switch unit according to claim 1, wherein the contact surfaces are designed for switching control currents for a control device of the consumer such that the control currents are guided via the strip conductors.

3. The steering-column switch unit according to Claim 1, wherein the add-on part is a punched part which is insert molded with plastic.

4. The steering-column switch unit according to Claim 1, wherein the add-on part is designed as an SMD component which is soldered on the printed circuit board in SMT technology.

5. The steering-column switch unit according to claim 1, wherein the add-on part is arranged in a recess of the printed circuit board.

6. The steering-column switch unit according to claim 1, wherein first contact surfaces for switching control currents are arranged on the printed circuit board, and the add-on part together with second contact surfaces for switching the load current via the first contact surfaces is arranged on the printed circuit board.

7. A motor vehicle with a steering-column switch unit according to claim 1.

8. A method for producing a steering-column switch unit for operating at least one electrical consumer, which is operated by an electric load current, in a motor vehicle, the method comprising:
    providing a printed circuit board for the steering-column switch unit:

wherein electrically conductive first contact surfaces for contact elements which are movable with a steering-column lever and strip conductors which are configured for the load current are provided on the printed circuit board, wherein the first contact surfaces are configured for switching the load current such that the load current is guided via the strip conductors, and wherein the first contact surfaces are surfaces of an add-on part which is fastened to the printed circuit board;

selecting a variant for the steering-column switch unit from at least one first variant and one second variant, wherein, in the first variant, electric control currents for a control device of the consumer are guided via the first contact surfaces and the strip conductors and, in the second variant, the load current is guided via the strip conductors;

when the first variant is selected, using the printed circuit board together with the first contact surfaces and the strip conductors for switching the control currents; and when the second variant is selected, fastening the add-on part together with second contact surfaces to the printed circuit board, said contact surfaces being electrically connected to the strip conductors, and using the printed circuit board together with the second contact surfaces of the add-on part and the strip conductors for switching the load current.

9. The method according to claim 8, wherein the add-on part is a punched part which is in particular insert molded with plastic.

10. The method according to claim 8, wherein the add-on part is designed as an SMD component which, after selection of the second variant, is soldered on the printed circuit board in SMT technology.

11. The method according to claim 8 wherein, after selecting the second variant, a recess is formed in the printed circuit board and the add-on part is arranged in the recess of the printed circuit board.

12. The method according to claim 8 wherein, after selecting the second variant, the add-on part together with the second contact surfaces is arranged on the printed circuit board via the first contact surfaces.

* * * * *